United States Patent
Vollrath et al.

(10) Patent No.: US 7,365,554 B2
(45) Date of Patent: Apr. 29, 2008

(54) INTEGRATED CIRCUIT FOR DETERMINING A VOLTAGE

(75) Inventors: Joerg Vollrath, Olching (DE); Marcin Gnat, Mering (DE); Aurel von Campenhausen, Cluvenhagen (DE); Ralf Schneider, München (DE)

(73) Assignee: Infineon Technologies AG, Neubiberg (DE)

( * ) Notice: Subject to any disclaimer, the term of this patent is extended or adjusted under 35 U.S.C. 154(b) by 63 days.

(21) Appl. No.: 11/092,885

(22) Filed: Mar. 29, 2005

(65) Prior Publication Data
US 2005/0213269 A1  Sep. 29, 2005

(30) Foreign Application Priority Data
Mar. 29, 2004  (DE) .................... 10 2004 015 269

(51) Int. Cl.
*G01R 31/02* (2006.01)
(52) U.S. Cl. ..................... 324/763; 324/765
(58) Field of Classification Search ............... 324/400, 324/763, 765
See application file for complete search history.

(56) References Cited

U.S. PATENT DOCUMENTS

| | | | | |
|---|---|---|---|---|
| 5,773,990 A | * | 6/1998 | Wilstrup et al. ............ 324/765 |
| 5,841,714 A | * | 11/1998 | Sher et al. .................. 365/201 |
| 5,949,725 A | * | 9/1999 | Sher ........................... 365/201 |
| 6,101,458 A | * | 8/2000 | Sugasawara et al. ........ 702/119 |
| 6,229,296 B1 | | 5/2001 | Duesman et al. |
| 6,339,357 B1 | | 1/2002 | Yamasaki |
| 6,498,508 B2 | * | 12/2002 | Umeki ....................... 324/765 |
| 6,504,394 B2 | * | 1/2003 | Ohlhoff ...................... 324/765 |
| 6,927,590 B2 | * | 8/2005 | Iadanza ..................... 324/763 |
| 7,058,865 B2 | * | 6/2006 | Mori et al. ................. 714/724 |
| 7,196,537 B2 | * | 3/2007 | von Campenhausen et al. ........................ 324/765 |
| 2003/0221149 A1 | | 11/2003 | Vollrath |

* cited by examiner

*Primary Examiner*—Ha Tran Nguyen
*Assistant Examiner*—Arleen M. Vazquez
(74) *Attorney, Agent, or Firm*—Edell, Shapiro & Finnan, LLC

(57) ABSTRACT

An integrated circuit includes a current generator circuit with a first input terminal for applying a reference voltage and a second input terminal for applying an input voltage, which is generated internally from an externally applied supply voltage by a voltage generator circuit. The current generator circuit is connected to an output terminal via an interconnect. A first current flows on the interconnect in a test operating state of the integrated circuit. The current generator circuit generates a first partial current in a first test cycle of a test operating state and a second partial current in a subsequent second test cycle. The partial currents are each superposed on the first current on the interconnect. Consequently, three currents occur at the output terminal during the test operating state. The internally generated input voltage of the current generator circuit is determined from the three currents and the reference voltage.

14 Claims, 2 Drawing Sheets

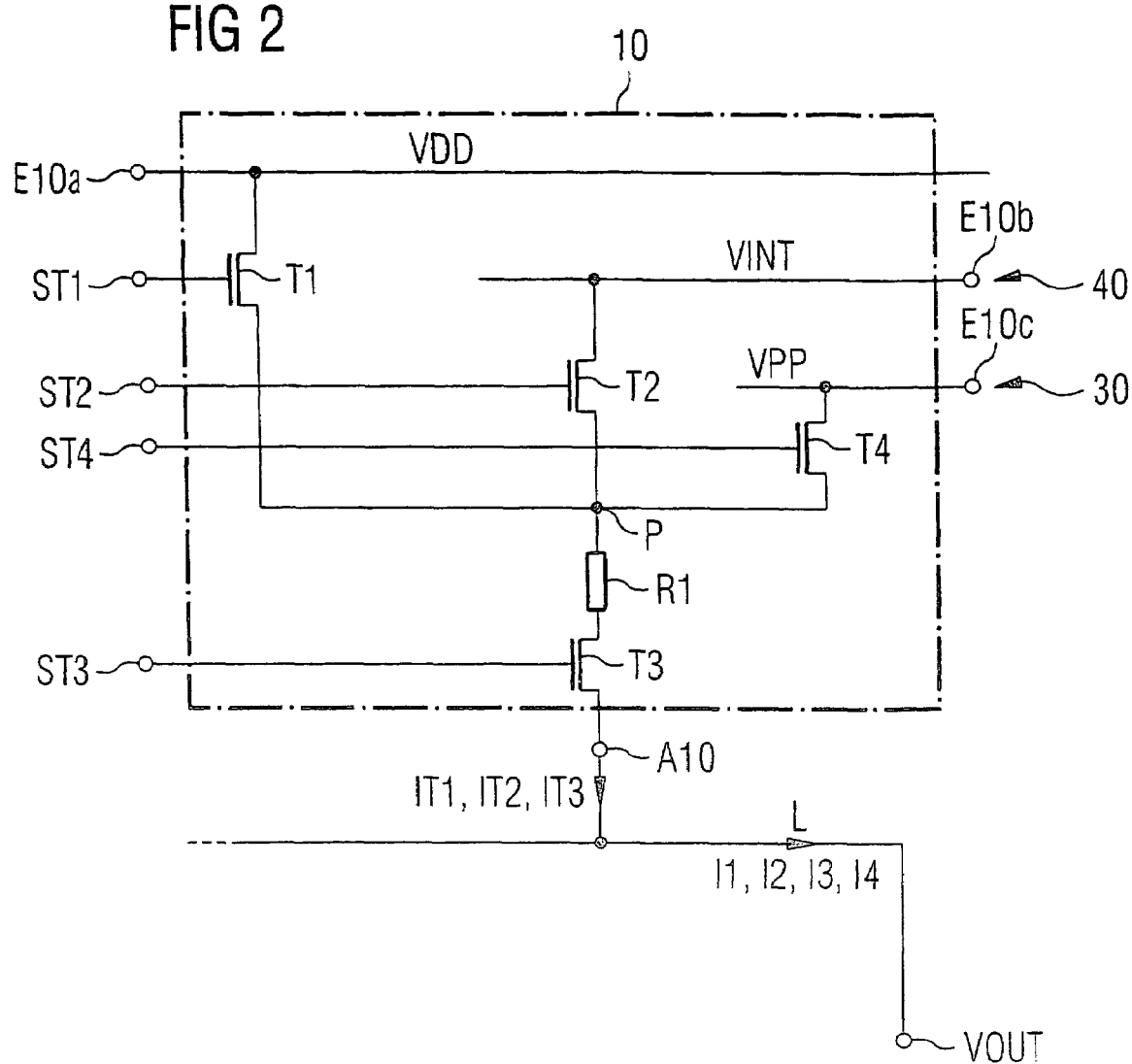

INTEGRATED CIRCUIT FOR DETERMINING A VOLTAGE

CROSS REFERENCE TO RELATED APPLICATIONS

This application claims priority under 35 USC §119 to German Application No. DE 102004015269.1, filed on Mar. 29, 2004, and titled "Integrated Circuit for Determining a Voltage," the entire contents of which are hereby incorporated by reference.

FIELD OF THE INVENTION

The invention relates to an integrated circuit which can be used to determine internal voltage potentials of an integrated semiconductor chip, in particular, an integrated semiconductor memory.

BACKGROUND

An integrated circuit generally contains a multiplicity of circuit components with different operating voltages. For this purpose, the integrated circuit contains voltage generator circuits, for example, voltage stabilization circuits or charge pumps, which can be used to derive internal operating voltages from an externally applied supply voltage. The internal voltage potentials provided by the generator circuits are significant to correct functioning of the circuit components of the integrated circuit. In particular, the magnitude of the internal voltages is crucial for proper operation of the integrated circuit components.

In the case of an integrated semiconductor memory, for example, a DRAM (=dynamic random access memory) semiconductor memory, the memory cells contain a storage capacitor, which can be conductively conducted to a bit line via a selection transistor. If an item of information is intended to be stored in the memory cells, then the selection transistor of the relevant memory cell is turned on, so that the storage capacitor is connected to the connected bit line at low impedance. If the item of information to be stored is a logic 1 information item, then the storage capacitor is charged to a voltage potential of 1.5 V, for example. In order that the logic 1 information item can be stored correctly in the memory cell, it must be ensured that a circuit component provided for this in the integrated circuit provides the stable voltage of 1.5 V corresponding to the logic 1 information item.

Therefore, there is great interest in measuring such internal voltage potentials both at the wafer level and at the component level, i.e., at the finished device. At the wafer level, there is either the possibility of replacing a defective internal voltage generator circuit by an intact circuit, or saving production costs by not constructing the damaged integrated circuit any further. At the component level, the measurement of internal voltage potentials of an integrated circuit makes it possible to ensure that only functional devices are supplied. Furthermore, there is the possibility of demarcating the cause of failure of a defective device in relation to the functioning of internal generator circuits.

In order to measure internal voltages at the wafer level, special metallic areas have been provided in the layout, via which metallic areas probes of a measurement system can measure internal voltages. However, viable chip area has been taken up in order to provide enough space for the probes of the measurement systems. Likewise, the layout of an integrated circuit has often not been able to be designed optimally in terms of circuitry due to the additional interconnects and terminal pads. Finally, with regard to the test systems used, a complex hardware has often been required in order, for example, to position the probes onto the metallic terminal areas provided therefore in the integrated circuit.

An integrated circuit, which can be used to determine internal voltage potentials without the use of expensive measurement systems at the wafer level and at the component level, and a method, which can be used to determine internally generated voltage potentials of an integrated circuit are desirable.

SUMMARY

An integrated circuit of the present invention can operate in a test operating state. The integrated circuit includes a current generator circuit with a first input terminal for applying a reference voltage and a second input terminal for applying an input voltage. The integrated circuit also includes an interconnect for carrying a current and an output terminal for application of a reference potential. The current generator circuit is connected to the output terminal via the interconnect on the output side. In this case, the current generator circuit generates a first partial current in a first test cycle of the test operating state and a second partial current in a subsequent second test cycle of the test operating state. The current intensity of the first partial current is dependent on the voltage value of the reference voltage and the current intensity of the second partial current is dependent on the voltage value of the input voltage.

If the interconnect is connected to circuit components in addition to the current generator circuit, a first current flows on the interconnect at the beginning of the test operating state. The first current represents a quiescent current of the circuit components which are deactivated in the test operating state and are connected to the interconnect. In the first test cycle, a second current flows on the interconnect as a result of activating of the current generator circuit. The second current is composed of the first current, i.e., the quiescent current, and the first partial current of the current generator circuit. In the second test cycle, a third current flows on the interconnect. The third current is composed of the first current and the second partial current of the current generator circuit. Because the current generator circuit is coupled to an interconnect already present, which connects the additional circuit components used during the normal operation of the integrated circuit to the output terminal, it is possible to dispense with an additional interconnect that would only be used in the test operating state. Consequently, valuable chip area is saved.

In one implementation of the integrated circuit, the current generator circuit is designed such that the first and second partial currents are each a constant DC current.

According to a feature of the integrated circuit, the current generator circuit has a first control terminal for applying a first control signal and a second control terminal for applying a second control signal. In this case, the current generator circuit generates the first partial current upon application of the first control signal and generate the second partial current upon application of the second control signal.

In another implementation of the integrated circuit, the current generator circuit includes a resistance, a first controllable switch with a control terminal, and a second controllable switch with a control terminal. The control terminal of the first controllable switch is connected to the first control terminal of the current generator circuit. The control terminal of the second controllable switch is connected to the second control terminal of the current generator circuit. In the first test cycle, the first input terminal of the current generator circuit is connected to the interconnect via the turned-on first controllable switch and the resistance. The second controllable switch is turned off in the first test cycle. In the second test cycle, the second input terminal of the current generator circuit is connected to the interconnect via the turned-on second controllable switch and the resistance. The first controllable switch is turned off in the second test cycle.

Furthermore, the current generator circuit may include a third control terminal for applying a third control signal and a third controllable switch with a control terminal. The control terminal of the third controllable switch is connected to the third control terminal of the current generator circuit. The third controllable switch is connected between the resistance and the interconnect.

In addition to the test operating state, the integrated circuit can also operate in a normal operating state. To operate the integrated circuit in the normal operating state, the integrated circuit has control terminals for applying control signals, and a control circuit for generating the first control signal, the second control signal, and the third control signal. The control circuit is connected to the control terminals of the integrated circuit on the input side and to the control terminals of the controllable switches on the output side. The first, second, and third controllable switches are turned off in the normal operating state. The third controllable switch is turned on in the first operating state. In this case, the control circuit is designed to generate the first control signal for turning on the first controllable switch in the first test cycle of the test operating state and generate the second control signal used for turning on the second controllable switch in the second test cycle of the test operating state.

In another refinement of the integrated circuit, the control circuit switches the integrated circuit from the normal operating state to the test operating state upon application of a signal combination including the control signals.

Since the reference represents a known voltage, the first input terminal of the current generator circuit is a terminal for applying a supply voltage. In this embodiment of the integrated circuit according to the invention, the externally applied supply voltage represents the reference voltage of the current generator circuit.

In an implementation of the integrated circuit, the second input terminal of the current generator circuit is a terminal for applying an internal voltage potential of the integrated circuit.

In accordance with a further embodiment, the integrated circuit has a terminal for applying the supply voltage and a voltage generator circuit, which generates the internal voltage potential. The voltage generator circuit is connected to the second input terminal of the current generator circuit on the output side.

In one implementation of the integrated circuit according to the invention, the voltage generator circuit is a charge pump. Alternatively, the voltage generator circuit may be a circuit for voltage stabilization.

In a further embodiment of the integrated circuit, the first, second, and third controllable switches are each a switching transistor.

In another refinement of the integrated circuit, the interconnect is connected to additional circuit components. Another current flows on the interconnect in the normal operating state. The current intensity of the current is dependent on a resistance of the additional circuit components.

A method for determining internal voltage potentials of an integrated circuit is described below. In a test operating state of the integrated circuit, a first current is generated on an interconnect connected to an output terminal of the integrated circuit. The, the current intensity of the first current at the output terminal is determined. In a subsequent first test cycle of the test operating state, a second current is generated at the output terminal by activating a first operating state of a current generator circuit. Next, the current increase at the output terminal in the first test cycle with respect to the current intensity of the first current is determined. In this case, the current increase at the output terminal of the integrated circuit corresponds to a first partial current generated by the current generator circuit in the first test cycle. A resistance of the current generator circuit is thereupon determined by forming a product of the current increase in the first test cycle and a reference voltage of the current generator circuit. In a subsequent second test cycle of the test operating state, a third current is generated at the output terminal by activating a second operating state of the current generator circuit. The, the current increase in the second test cycle with respect to the first current is determined. In this case, the current increase at the output terminal of the integrated circuit corresponds to a second partial current generated by the current generator circuit in the second test cycle. A voltage value of an input voltage of the current generator circuit can thereupon be determined by forming a product of the value of the current increase in the second test cycle and the value of the resistance of the current generator circuit.

The reference voltage is applied to a first input terminal of the current generator circuit, and the input voltage is applied to a second input terminal of the current generator circuit. Thus, a third switching transistor is on at the beginning of the test operating state of the integrated circuit. In the subsequent first cycle, a first partial current of the current generator circuit is generated by turning on a first switching transistor, so that the first input terminal of the current generator circuit is connected to the interconnect via the turned-on first switching transistor and the resistance. In the subsequent second test cycle, a second partial current of the current generator circuit is generated by turning on a second switching transistor, so that the second input terminal of the current generator circuit is connected to the interconnect via the turned-on second switching transistor and the resistance.

By determining currents generated during the test operating state of the integrated circuit, an unknown internal voltage potential that is used as input voltage for the current generator circuit is determined. Since it is possible to measure the currents at the output terminal of the integrated circuit, the housing cover of an already welded device is not opened. The method of the present invention, as described is suitable in particular, for determining internally generated voltage potentials at the component level of an integrated circuit, i.e., when the integrated circuit has already been welded in a device housing.

Likewise, large-area contact areas in the circuit layout are no longer provided with probes of a measurement system that must contact the circuit layout in order to tap off the internally generated voltages. Instead of complicated test apparatus, relatively simple measurement apparatus is connected to the output terminal of the integrated circuit for determining the currents.

The use of the output terminal of the integrated circuit as an interface between measurement apparatus and integrated circuit, with which the measurement system can be connected in a relatively straightforward manner, also makes it possible to dispense with the use of complex positioning systems. Such positioning systems have been required hitherto for positioning the probes at the contact areas provided therefore in the layout.

BRIEF DESCRIPTION OF THE DRAWINGS

The invention is explained in more detail below with reference to figures that illustrate exemplary embodiments of the invention. In the figures, FIG. 2 shows a second embodiment of an integrated circuit for determining internal voltage potentials.

DETAILED DESCRIPTION

Figure 1:
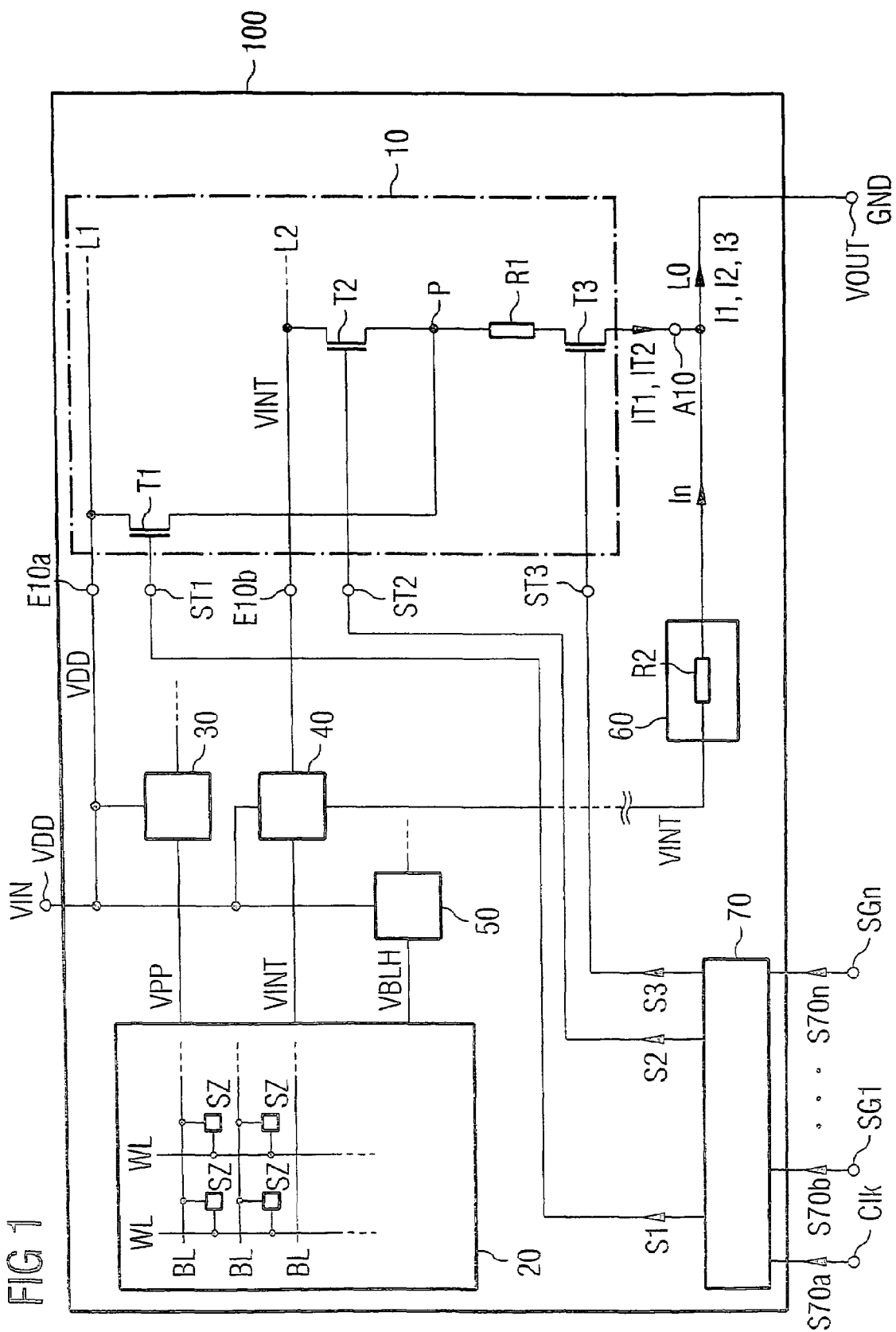
FIG. 1 shows an integrated semiconductor memory with a first embodiment of an integrated circuit for determining internal voltage potentials.

FIG. 1 shows an integrated semiconductor memory 100 with a first embodiment of an integrated circuit according to the invention, which can be used to determine internal voltage potentials. The integrated semiconductor memory includes a current generator circuit 10, a memory cell array 20, voltage generator circuits 30, 40, 50, which may be, for example, a charge pump 30 or voltage stabilization circuits 40, 50, additional circuit components 60, and a control circuit 70. The memory cell array 20 is constructed from row and column lines arranged in matrix form, the word and bit lines. Memory cells SZ are arranged between a respective word and bit line. The control terminals of the selection transistors, which are connected to the word lines WL are driven by control voltages VPP, the level of which lies above an externally provided supply potential VDD. Charge pumps 30 are used for generating these word line voltages. The memory cell array 20 is supplied with a first internal voltage potential VINT by the voltage generator circuit 40 and with a second internal voltage potential VBLH by the voltage generator circuit 50. In this case, the voltage potential VINT corresponds, for example, to an internal voltage potential that lies between a high voltage potential VBLH and a low reference potential GND. The voltage potential VBLH corresponds, for example, to the voltage potential to which a storage capacitor of a DRAM memory cell SZ is charged if a logic 1 information item is stored in the memory cell. The voltage generator circuits 30, 40, 50 derive the internal voltage potentials from an externally applied supply voltage VDD. The voltage generator circuits 30, 40, 50 are therefore connected to an input terminal VIN of the integrated semiconductor memory for applying the external supply potential VDD.

The circuit component 60 is representative of further circuit units, for example, decoder circuits or control circuits, which are likewise connected to the internal supply potential VINT. The circuit component 60 includes a nonreactive resistance R2 connected to the internal supply voltage VINT and, via an interconnect L0, to an output terminal VOUT of the integrated semiconductor memory for applying the reference potential GND. In the normal operating state of the integrated circuit, a load current In flows on the interconnect L0 through the active circuit components 60. The load current is dependent on the nonreactive resistance R2 of the circuit components. A quiescent current I1 flows on the interconnect L0 in the test operating state, in which the circuit components 60 are in a deactivated operating state.

The current generator circuit 10 includes a first switching transistor T1, via the controllable path of which a line L1 charged to the supply potential VDD is connected to an internal terminal point P. For this purpose, the line L1 is connected, via a first input terminal E10a of the current generator circuit 10, to the input terminal VIN of the semiconductor memory for applying the supply potential VDD. The current generator circuit 10 includes a second switching transistor T2, via the controllable path of which a line L2 charged to the internal voltage potential VINT by the voltage generator circuit 40 is connected to the terminal point P. For this purpose, the line L2 is connected via a second input terminal E10b of the current generator circuit 10, to the voltage stabilization circuit 40 for generating the internal voltage potential VINT. The common terminal point P of the first switching transistor T1 and of the second switching transistor T2 is connected to the interconnect L0 via a resistance R1 and the controllable path of a further switching transistor T3.

On the input side, the control circuit 70 is connected to control terminals S70a, S70b, . . . , S70n of the integrated semiconductor memory for applying control signals CLK, SG1, . . . , SGn. The control circuit 70 controls the switching transistors T1, T2, and T3 of the current generator circuit. For this purpose, the control circuit 70 feeds control signals S1, S2 and S3 to control terminals ST1, ST2, ST3 of the switching transistors.

The functioning of the integrated circuit for determining the internal voltage potential VINT is described below. By a characteristic signal combination, which may be formed from the control clock CLK and the remaining control signals SG1, . . . , SGn, the control circuit 70 operates the integrated semiconductor memory in a test operating state. The internal voltage VINT generated by the voltage generator circuit 40 can be determined in this test operating state in the exemplary embodiment of FIG. 1. Circuit components 60 are deactivated in the test operating state of the integrated semiconductor memory. The quiescent current I1 flows on the line L0 connected to the output terminal VOUT. The control circuit 70 then drives the control terminal ST3 of the switching transistor T3 with the control signal S3. The switching transistor T3 is turned on thereby. In a subsequent first test cycle of the test operating state, the switching transistor T1 is turned on by driving with the control signal S1 from the control circuit 70. If it is assumed that the respective controllable path of the switching transistors T1 and T3 can be ideally turned on, so that its respective resistance is negligible, then a partial current IT1 having the current intensity $$\frac{VDD}{R1}$$

flows via the resistance R1. There consequently arises on the interconnect L0 a second current having the current intensity I2:

$$I2 = I1 + \frac{VDD}{R1}$$

The current intensity of the second current I2 can be measured by a test apparatus connected to the output terminal VOUT. By the known externally applied supplied voltage VDD and the measured first and second currents I1 and I2, the unknown resistance R1 can be determined as:

$$R1 = \frac{VDD}{I2 - I1}$$

In a subsequent second test cycle of the test operating state, the switching transistor T1 is turned off again by the control circuit 70. The switching transistor T2 is turned on by driving with the control signal S2 from the control circuit 70. If it is assumed that the switching transistor T2 can be ideally turned on, then the nonreactive resistance of its controllable path can be disregarded. A current component of a second partial current IT2 having the current intensity $$\frac{VINT}{R1}$$

thus arises at the output terminal A10 of the current generator circuit 10. There thus arises on the interconnect L0, in the second test cycle of the test operating state, a third current I3 having the current intensity $$I3 = I1 + \frac{VINT}{R1}.$$

The current intensity of the third current I3 can be measured by a measurement apparatus connected to output terminal VOUT. The unknown internal voltage potential VINT can thus be determined as:

$$VINT = R1*(I3-I1)$$

or can be determined with the known resistance R1 as:

$$VINT = \frac{VDD}{(I2-I1)} * (I3-I1)$$

The integrated circuit according to the invention thus makes it possible to determine internal voltage potentials by a known supply voltage VDD and by measuring the quiescent current I1 and a second current I2 in the first test cycle and a third current I3 in the second test cycle of the test operating state. The integrated circuit, in particular, the current generator circuit 10, takes up substantially less space in the layout than has been necessary hitherto in the circuit design for the configuration of metallic terminal areas for the probes of measurement systems. Likewise, the measurement apparatus to be used can be designed substantially more cost-effectively since only current intensities have to be measured at the output terminal VOUT. Consequently, a test system of complicated configuration with probes and positioning devices for positioning the probes onto the metallic terminal areas provided therefore in the integrated circuit is no longer required.

FIG. 2 shows a further configuration of the integrated circuit, in particular of the current generator circuit 10 for determining internal voltage potentials. In addition to the circuit components already described in FIG. 1, the current generator circuit 10 of the second embodiment also contains a further second switching transistors T4, via the controllable path of which a further internal voltage potential can be connected to the terminal point P. This internal voltage potential may, in this case, be the voltage potential VPP generated by the charge pump 30 in FIG. 1. In order to determine this voltage potential, the integrated circuit is again operated in the test operating state. All switching transistors T1, T2, T3, T4 are turned off at the beginning of the test operating state. The quiescent current I1, generated by additional circuit components that are not illustrated here, thus flows on the interconnect L0. In the first test cycle of the test operating state, the switching transistor T1 is turned on, so that a summation current I2 composed of the quiescent current I1 and the first partial current IT1 generated at the output terminal A10 of the current generator circuit 10 flows on the interconnect L0. In the second test cycle of the test operating state, the second switching transistor T4 is turned on via its control terminal ST4. A summation current I4 composed of the quiescent current I1 and a partial current IT3 occurring at the output terminal A10 of the current generator circuit 10 thus flows on the interconnect L0. Through the measurement of the current intensities I1, I2 and I4 at the output terminal VOUT, the unknown internal voltage VPP can be determined as:

$$VPP = \frac{VPP}{(I2-I1)} * (I4-I1)$$

The current generator circuit 10 can be extended in a very straightforward manner by connecting additional switching transistors to the terminal point P. It is thus possible, for example, to connect a further one of the second switching transistors between the internal terminal P and a line which, for example, is connected to the voltage stabilization circuit 50 for generating the voltage level VBLH. Due to the small space requirement of further second switching transistors, a multiplicity of internal voltage potentials of the integrated circuit can be determined.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

LIST OF REFERENCE SYMBOLS

10 Current generator circuit
20 Memory cell array
30 Charge pump
40, 50 Voltage stabilization circuit
60 Circuit component
70 Control circuit
WL Word line
BL Bit line
SZ Memory cell
VPP Internal word line voltage
VINT Internal voltage potential
VBLH Internal logic high voltage
E Input terminal of the current generator circuit A Output terminal of the current generator circuit
VIN Terminal for supply potential
VOUT Output terminal for reference potential
GND Ground reference potential
S Internal control signal
SG External control signal
CLK Control clock
S70 Control terminals of the control circuit
ST Control terminal of the switching transistor
T Switching transistor
L Interconnect
R Resistance
P Internal terminal point
IT1, IT2 Partial currents
I1, I2, I3 Currents on the interconnect
In Load current

What is claimed is:

1. An integrated circuit for supplying currents to a test apparatus for determining a voltage in the integrated circuit, the integrated circuit being operable in a test operating state including a first and a second test cycle, the integrated circuit comprising:
    a current generator circuit with a first input terminal for applying a reference voltage and a second input terminal for applying a voltage to be determined, the current generator circuit including a first control terminal for applying a first control signal and a second control terminal for applying a second control signal;
    an output terminal coupled to the test apparatus; and
    an interconnect for carrying a current, the interconnect coupling the current generator circuit to the output terminal,
    wherein the current generator circuit generates a first partial current upon application of the first control signal in the first test cycle of the test operating state and a second partial current upon application of the second control signal in the second test cycle of the test operating state, the current intensity of the first partial current being dependent on the voltage value of the reference voltage, and the current intensity of the second partial current being dependent on the voltage value of the said voltage to be determined,
    the interconnect supplying the first and second partial currents to the test apparatus for determining said voltage to be determined as a function of the reference voltage, the first partial current and the second partial current.

2. The integrated circuit as claimed in claim 1, wherein the current generator circuit is designed such that the first and second partial currents are each a constant DC current.

3. The integrated circuit as claimed in claim 1, wherein the current generator circuit includes a resistance, a first controllable switch with a control terminal and a second controllable switch with a control terminal, the control terminal of the first controllable switch is connected to the first control terminal of the current generator circuit, the control terminal of the second controllable switch is connected to the second control terminal of the current generator circuit, in the first test cycle, the first input terminal of the current generator circuit is connected to the interconnect via the turned-on first controllable switch and the resistance and the second controllable switch is turned off, in the second test cycle, the second input terminal of the current generator circuit is connected to the interconnect via the turned-on second controllable switch and the resistance and the first controllable switch is turned off.

4. The integrated circuit as claimed in claim 3, wherein the current generator circuit includes a third control terminal for applying a third control signal and a third controllable switch with a control terminal, the control terminal of the third controllable switch is connected to the third control terminal of the current generator circuit, the third controllable switch is connected between the resistance and the interconnect.

5. The integrated circuit as claimed in claim 4, which can be operated in a normal operating state, further comprising:
    control terminals for applying control signals; and
    a control circuit for generating the first control signal, the second control signal, and the third control signal,
    wherein the control circuit is connected to the control terminals on the input side and to the control terminals of the controllable switches on the output side, the first, second, and third controllable switches are turned off in the normal operating state, the third controllable switch is turned on in the test operating state, the control circuit generates the first control signal for turning on the first controllable switch in the first test cycle of the test operating state, the control circuit generates the second control signal for turning on the second controllable switch in the second test cycle of the test operating state.

6. The integrated circuit as claimed in claim 5, wherein the control circuit switches the integrated circuit from the normal operating state to the test operating state upon application of a signal combination including the control signals.

7. The integrated circuit as claimed in claim 5, wherein the interconnect is connected to additional circuit components, a second current flows on the interconnect in the normal operating state, the current intensity of the second current depending on a resistance of the additional circuit components.

8. The integrated circuit as claimed in claim 5, wherein the interconnect is connected to additional circuit components, a first current flows on the interconnect in the test operating state, the first current being a quiescent current of the circuit components which are deactivated in the test operating state and are connected to the interconnect, a second current flows on the interconnect in the first test cycle, the second current comprising the first current and the first partial current of the current generator circuit, and a third current flows on the interconnect in the second test cycle, the third current comprising the first current and the second partial current of the current generator circuit.

9. The integrated circuit as claimed in claim 4, wherein the first, second, and third controllable switches are each a switching transistor.

10. The integrated circuit as claimed in claim 1, wherein the reference voltage is a supply voltage.

11. The integrated circuit as claimed in claim 10, wherein the voltage to be determined is an internal voltage potential of the integrated circuit.

12. The integrated circuit as claimed in claim 11, further comprising:
    a terminal for applying the supply voltage; and
    a voltage generator circuit, which generates the internal voltage potential,
    wherein the voltage generator circuit is connected to the second input terminal of the current generator circuit on the output side.

13. The integrated circuit as claimed in claim 12, wherein the voltage generator circuit is a charge pump.

14. The integrated circuit as claimed in claim 12, wherein the voltage generator circuit is a circuit for voltage stabilization.

* * * * *